United States Patent [19]
Kado et al.

[11] Patent Number: 5,731,598
[45] Date of Patent: Mar. 24, 1998

[54] SINGLE ELECTRON TUNNEL DEVICE AND METHOD FOR FABRICATING THE SAME

[75] Inventors: Hiroyuki Kado, Osaka; Takao Tohda, Ikoma; Ichiro Tanahashi, Hirakata; Yoshio Manabe, Katano, all of Japan

[73] Assignee: Matsushita Electric Industrial Co. Ltd., Kadoma, Japan

[21] Appl. No.: 665,890

[22] Filed: Jun. 19, 1996

[30] Foreign Application Priority Data

Jun. 23, 1995 [JP] Japan .................................. 7-157521
Jun. 23, 1995 [JP] Japan .................................. 7-157522

[51] Int. Cl.⁶ ........................... H01L 29/06; H01L 39/00
[52] U.S. Cl. ........................... 257/30; 257/14; 257/24; 257/39
[58] Field of Search ........................... 257/14, 24, 30, 257/39

[56] References Cited

U.S. PATENT DOCUMENTS

| | | | |
|---|---|---|---|
| 5,289,408 | 2/1994 | Mimura et al. | 365/151 |
| 5,416,040 | 5/1995 | Beam, III et al. | 437/60 |
| 5,420,749 | 5/1995 | Smith | 361/311 |
| 5,422,496 | 6/1995 | Kamohara et al. | 257/24 |

FOREIGN PATENT DOCUMENTS

| | | | |
|---|---|---|---|
| 576263A2 | 12/1993 | European Pat. Off. | G01L 21/28 |
| BB43768 | 5/1997 | European Pat. Off. | |
| 05283759 | 10/1993 | Japan | H01L 39/22 |
| 07106549 | 4/1995 | Japan | H01L 29/66 |
| 7226522 | 8/1995 | Japan | |
| 7276522 | 8/1995 | Japan | |

OTHER PUBLICATIONS

"Single-electron effects in a point contact using side-gating in delta-doped layers" Nakazato, et al. Appl. Phys. Lett., vol. 61, No. 26, Dec. 28, 1992 ©1992 American Institute of Physics.
"A Room-Temperature Single-Electron Memory Device Using Fine-Grain Polycrystalline Silicon" Yano, et al. ULSI Research Center, Hitachi Central Research Laboratory, Kokubunji, Tokyo 185, Japan ©1993 IEEE IDEM 541–543.
Wang et al., "Charging Effects Observed By Low-Temperature Scanning Tunnelling Microscopy Of Gold Islands", *Surface Science*, vol. 322, No. 1–3, pp. 325–336, Jan. 1995.
Katayama et al.; "A New Field-Effect Transistor Based On The Metal-Insulator Transition", *Journal Of Applied Physics*, vol. 79, No. 5, pp. 2542–2548, Mar. 1996.
"A Room-Temperature Single-Electron Memory Device using Fine Grain Poly Crystalline Silicon" Yano et al IDEM 541–543 1993.

*Primary Examiner*—Sara W. Crane
*Assistant Examiner*—Douglas Wille
*Attorney, Agent, or Firm*—Renner, Otto, Boisselle & Sklar, P.L.L.

[57] ABSTRACT

The single electron tunnel device of this invention includes: a multiple tunnel junction layer including multiple tunnel junctions; and first and second electrodes for applying a voltage to the multiple tunnel junction layer, wherein the multiple tunnel junction layer includes an electrically insulating thin film and metal particles and/or semiconductor particles dispersed in the electrically insulating thin film.

20 Claims, 8 Drawing Sheets

5,731,598

SINGLE ELECTRON TUNNEL DEVICE AND METHOD FOR FABRICATING THE SAME

BACKGROUND OF THE INVENTION

1. Field of the Invention

The present invention relates to a single electron tunnel device which utilizes multiple tunnel junctions and can be operated based on individual electrons, and a method for fabricating such a single electron tunnel device.

2. Description of the Related Art

LSIs which support today's information-oriented society have been highly integrated with the miniaturization of semiconductor devices such as transistors. By miniaturizing the devices, the travel distance and capacity of carriers are reduced, allowing for high-speed operation and high performance of LSIs. The gate length is 0.5 μm for 16M DRAMs which are now under mass-production. It is about 0.35 μm for 64M DRAMs which are in the initial stage of sample delivery. In laboratories, operation check for the gate length of 0.1 μm or less is underway.

As the devices are further miniaturized, however, some problems arise. As a physical problem, a tunnel leak current occurs between a gate electrode and a semiconductor substrate of the device. As a fundamental problem, since the number of electrons per operation reduces, the statistical variation in the number of electrons increases, causing miss-operation to easily occur. To overcome these problems, a single electron tunnel device has been proposed which operates by controlling individual electrons, unlike conventional LSIs which operate based on the statistical properties of electrons. The single electron tunnel device is characterized in that as the device is more miniaturized the operation is closer to obtaining the ultimate characteristics of the device. If this device is used as a memory, for example, the resultant memory operates six-digits faster then the human brain and has a capacity six-digits larger than the existing semiconductor memories.

The single electron tunnel device operates based on the Coulomb blockade effect. In order to obtain this effect, a multiple tunnel junction layer where several or more tunnel junctions are connected in series is required and the capacitance of islands interposed between the tunnel junctions needs to be small. In particular, in consideration of operation at room temperature, the capacitance of islands needs to be 1 aF or less. To achieve this, a technique of forming a fine structure with a size on the order of nanometers is required.

The technique of forming such a fine structure has not yet been put into practical use. Instead, some devices utilizing natural structures have been suggested. Examples of such structures include a multiple tunnel junction structure where a side gate is formed on the side of an atomic layer doping GaAs strip as described in Appl. Phys. Lett., Vol. 61, 1992, p. 3145, and a single electron memory using ultra thin polysilicon as a channel as described in Proc. IEDM, 1993, p. 541.

The above structures have the following problems. In the former, tunnel junctions are formed using the random distribution of charged impurities in the GaAs strip, while in the latter, grains in the polysilicon are used as islands, and the portion of the polysilicon where electrons easily flow is used as the channel. In both cases, therefore, it is difficult to fabricate the structures with good controllability, causing a variation in the characteristics of the resultant devices.

SUMMARY OF THE INVENTION

The single electron tunnel device of this invention includes: a multiple tunnel junction layer including multiple tunnel junctions; and first and second electrodes for applying a voltage to the multiple tunnel junction layer, wherein the multiple tunnel junction layer includes an electrically insulating thin film and metal particles and/or semiconductor particles dispersed in the electrically insulating thin film.

In one embodiment of the invention, the single electron tunnel device further includes: an electrically insulating layer formed in contact with the multiple tunnel junction layer; and a third electrode for applying an electric field to the multiple tunnel junction layer via the electrically insulating layer.

In another embodiment of the invention, the diameter of the particles is 50 nm or less.

In still another embodiment of the invention, the average distance between the particles is 5 nm or less.

In still another embodiment of the invention, the particles are dispersed in layers in the multiple tunnel junction layer.

In still another embodiment of the invention, the electrically insulating thin film is made of an oxide, and the particles are made of at least one type of metal selected from the group consisting of gold (Au), silver (Ag), copper (Cu), platinum (Pt), and palladium (Pd).

In still another embodiment of the invention, the electrically insulating thin film includes as a major component at least one type of material selected from the group consisting of oxides of silicon (Si), aluminum (Al), titanium (Ti), and hafnium (Hf), and nitrides of silicon (Si) and aluminum (Al).

Alternatively, the single electron tunnel device of this invention includes: a resistance layer; first and second electrodes for applying a voltage to the resistance layer; and a third electrode for adjusting an electric field formed by the first and second electrodes, wherein the resistance layer includes an electrically insulating substance with low-potential islands formed therein.

In one embodiment of the invention, the first electrode is formed on a first major plane of the resistance layer, and the second electrode is formed on a second major plane of the resistance layer which is different from the first major plane.

In another embodiment of the invention, the first and second electrodes are formed on a same plane of the resistance layer.

In still another embodiment of the invention, the distance between portions of the first and second electrodes which are closest to each other is 1 μm or less, and the width of at least one of the first and second electrodes is 100 nm or less.

In still another embodiment of the invention, at least one of the first and second electrodes has a tapered end, and the tapered end faces the other electrode.

In still another embodiment of the invention, a tip portion of the first electrode overlaps a tip portion of the second electrode, and the area of the overlapping portion is 1 μm$^2$ or less.

In still another embodiment of the invention, the resistance layer includes an electrically insulating thin film and metal particles and/or semiconductor particles dispersed in the electrically insulating thin film.

In still another embodiment of the invention, metal particles and/or semiconductor particles are dispersed three-dimensionally in the resistance layer.

In still another embodiment of the invention, the diameter of the particles is 50 nm or less.

In still another embodiment of the invention, the average distance between the particles is 5 nm or less.

In still another embodiment of the invention, the particles are dispersed in layers in the electrically insulating substance.

In still another embodiment of the invention, the electrically insulating substance is made of an oxide or a nitride.

In still another embodiment of the invention, the electrically insulating thin film is made of an oxide, and the particles are made of at least one type of metal selected from the group consisting of gold (Au), silver (Ag), copper (Cu), platinum (Pt), and palladium (Pd).

In still another embodiment of the invention, the electrically insulating thin film includes as a major component at least one type of material selected from the group consisting of oxides of silicon (Si), aluminum (Al), titanium (Ti), and hafnium (Hf), and nitrides of silicon (Si) and aluminum (Al).

According to another aspect of the invention, a method for fabricating a single electron tunnel device is provided. The device includes: a multiple tunnel junction layer including multiple tunnel junctions: and first and second electrodes for applying a voltage to the multiple tunnel junction layer, wherein the multiple tunnel junction layer includes an electrically insulating thin film and metal particles and/or semiconductor particles dispersed in the electrically insulating thin film. The method includes the step of: forming the multiple tunnel junction layer by repeating the sub-steps of depositing an electrically insulating substance and forming metal and/or semiconductor particles alternately.

Alternatively, a method of this invention for fabricating a single electron tunnel device is provided. The device includes: a multiple tunnel junction layer including multiple tunnel junctions; and first and second electrodes for applying a voltage to the multiple tunnel junction layer, wherein the multiple tunnel junction layer includes an electrically insulating thin film and metal particles and/or semiconductor particles dispersed in the electrically insulating thin film. The method includes the step of: forming the multiple tunnel junction layer by depositing an electrically insulating substance and metal and/or semiconductor particles simultaneously.

In one embodiment of the invention, the multiple tunnel junction layer is formed by alternate sputtering.

In another embodiment of the invention, the method further includes the step of heat-treating the multiple tunnel junction layer so as to change the size or density of the particles.

Thus, according to the present invention, since metal or semiconductor particles are dispersed in the electrically insulating thin film with high density, electrons tunnel through the gaps between the metal or semiconductor particles when a voltage is applied between electrodes, allowing a so-called tunnel current to flow in the electrically insulating thin film. Accordingly, by forming electrodes in contact with the electrically insulating thin film with metal and semiconductor particles dispersed therein and applying a voltage between the electrodes, a multiple tunnel junction structure is formed where electrons flow between the electrodes through a number of tunnel junctions connected in series, and thus a single electron tunnel device using the Coulomb blockage effect is realized. Since the metal or semiconductor particles can be dispersed in the electrically insulating thin film comparatively uniformly, a multiple tunnel junction structure with a controlled configuration can be easily obtained.

According to the present invention, a pair of thin film electrodes, each of the pair facing each other, are formed on the upper or lower surface of the resistance thin film layer. A channel portion is therefore formed in the portion of the resistance thin film layer between the electrodes where the electric field is strongest. Electrons move between the metal or semiconductor particles in the channel portion of the resistance thin film layer due to the tunnel effect. This makes it possible to realize a single electron tunnel device using the Coulomb blockade effect by only a minor processing step such as sharpening the ends of the opposing electrodes to reduce the width of the channel portion, without the necessity of an electron beam lithographic technique.

According to the present invention, thin film electrodes are formed on the upper and lower surfaces of the resistance thin film layer so that portions of the electrodes interpose the resistance thin film layer. A channel portion is therefore formed in the portion of the resistance thin film layer interposed by the electrodes where the electric field is strongest. Electrons move between the metal or semiconductor particles in the channel portion of the resistance thin film layer due to the tunnel effect. This makes it possible to realize a single electron tunnel device using the Coulomb blockade effect by only a minor processing such as sharpening ends of the opposing electrodes to reduce the area of the interposed portion, without the necessity of an electron beam lithographic technique.

Thus, the invention described herein makes possible the advantages of (1) providing a single electron tunnel device of which configuration and characteristics are controlled, and (2) providing a method for fabricating such a single electron tunnel device.

These and other advantages of the present invention will become apparent to those skilled in the art upon reading and understanding the following detailed description with reference to the accompanying figures.

DESCRIPTION OF THE PREFERRED EMBODIMENTS

The present invention will be described by way of examples with reference to the accompanied drawings as follows.

(EXAMPLE 1)

Figure 1:
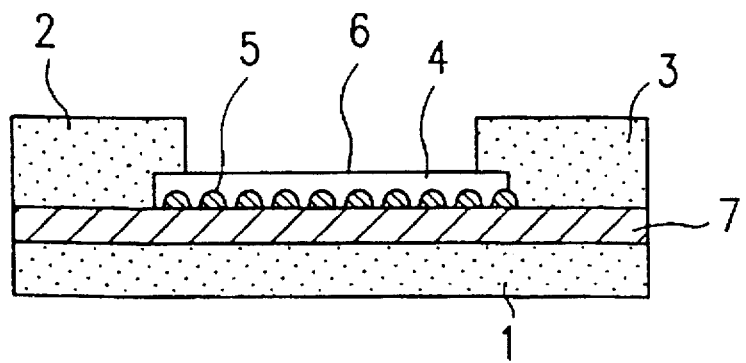
FIG. 1 is a schematic sectional view of a single electron tunnel device according to the present invention.

Referring to FIG. 1, a first example of the single electron tunnel device according to the present invention will be described.

The single electron tunnel device of this example includes a multiple tunnel junction layer 6 having multiple tunnel junctions, a source electrode 2 and a drain electrode 3 for applying a voltage to the multiple tunnel junction layer 6, and a gate electrode 1 for applying an electric field to the multiple tunnel junction layer 6 via an insulating film 7.

The multiple tunnel junction layer 6 is composed of an electrically insulating thin film 4 and a number of particles 5 dispersed therein. The gate electrode 1, the source electrode 2, and the drain electrode 3 are made of conductive materials such as metal and semiconductor materials. The particles 5 are made of metal or semiconductor materials. Preferably, the particles 5 are made of thermally and chemically stable materials, especially materials such as precious metals. The electrically insulating thin film 4 and the insulating film 7 can be made of a material which has a conductivity low enough to allow a change in a tunnel current to be detected, such as oxides, nitrides, and organic materials.

It is important to adjust the distance between the particles so that a tunnel current can flow in the electrically insulating thin film 4.

Figure 10:
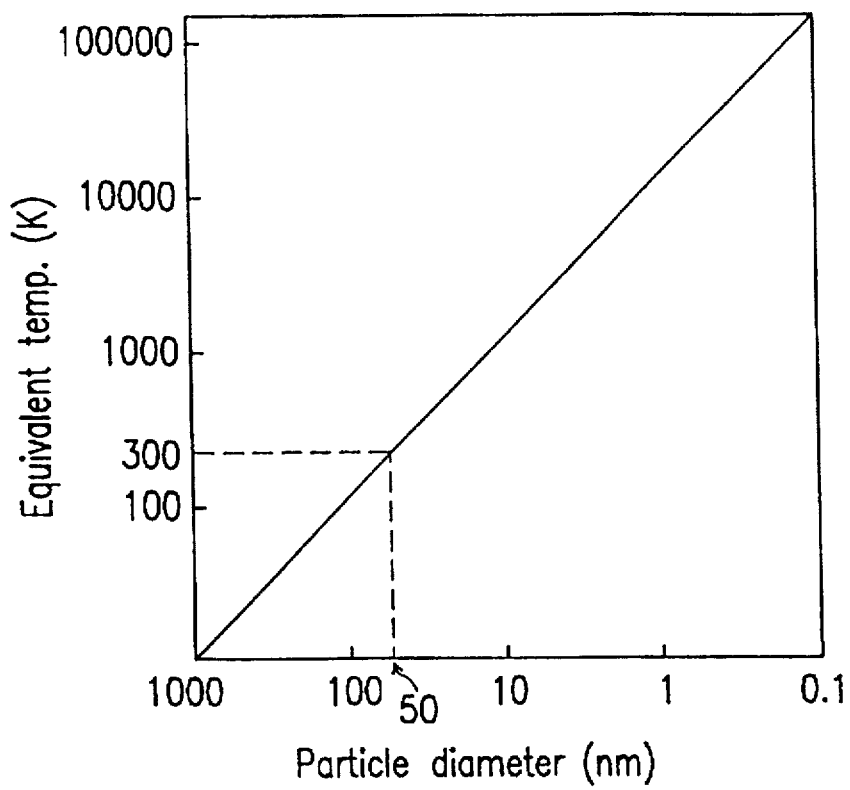
FIG. 10 is a graph showing the relationship between the diameter of a particle and the temperature equivalent to the charging energy required when the particle is charged with one electron.

In order to obtain the Coulomb blockade effect, a charging energy required when one particle 5 is charged with one electron should be larger than the heat energy of the electron. FIG. 10 shows the relationship between the size of the particle and the temperature equivalent to the charging energy required when the particle is charged with one electron. It is observed from FIG. 10 that the particle size needs to be 50 nm or less in order to obtain a memory operable at room temperature (300° K.). Thus, the size of the particles 5 is preferably in the range of about 1 to 50 nm.

A single electron tunnel device operable at a comparatively high temperature was obtained when the volume ratio of the particles 5 to the electrically insulating thin film 4 was in the range of 5 to 70%.

Hereinbelow, a method for forming the multiple tunnel junction layer 6 of this example using a sputtering apparatus shown in FIG. 2 will be described.

Figure 2:
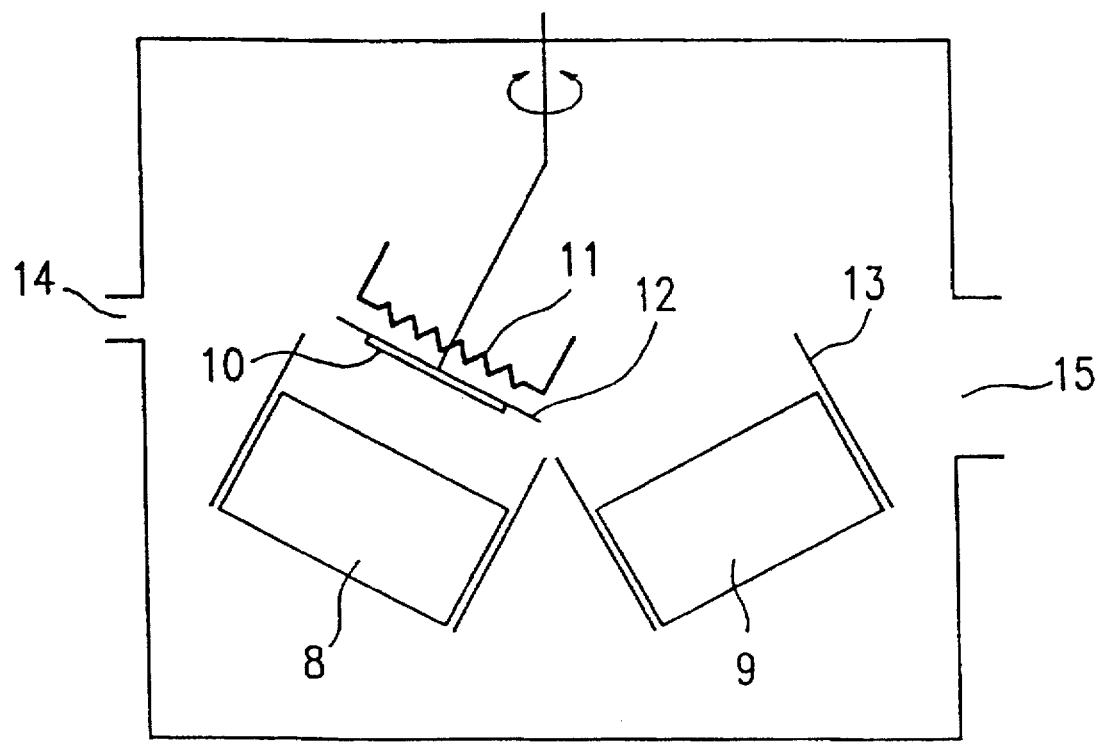
FIG. 2 is a schematic sectional view of a sputtering apparatus used for fabricating the single electron tunnel device according to the present invention.

At least two types of sputtering targets are placed in a chamber of the sputtering apparatus of FIG. 2. In this example, a quartz ($SiO_2$) glass target 8 and a gold (Au) target 9 are used.

A substrate 10 on which the gate electrode 1 and the insulating film 7 are formed is secured to a substrate holder 12 provided with a heater 11. The substrate 10 can be moved to the positions above the $SiO_2$ glass target 8 and the Au target 9 by a rotational axis coupled to the substrate holder 12. The position of the substrate 10 and the period of time during which the substrate 10 stays above each target are controlled by a computer.

A shield 13 surrounds each target and extends upward to prevent contamination during the sputtering.

Argon is preferably used as a sputtering gas. The sputtering gas is introduced into the chamber via a gas inlet 14 and exhausted from a gas outlet 15 which is connected with a vacuum exhaust system. The gas pressure is maintained at 1.0 Pa, for example, and the substrate temperature is maintained at 200° C. The voltages applied to the $SiO_2$ glass target 8 and the Au target 9 are, for example, 250 W and 10 W, respectively.

The multiple tunnel junction layer 6 is formed in the following manner.

First, the substrate 10 is moved to the position above the Au target 9 and stays there for 20 seconds to allow Au particles to be deposited on the insulating film 7 on the substrate 10. Then, the substrate 10 is moved to the position above the $SiO_2$ glass target 8 and stays there for five minutes to allow $SiO_2$ to be deposited over the Au particles forming an $SiO_2$ film with a thickness of 0.1 µm. The thus-formed $SiO_2$ film with Au particles dispersed therein was observed in section with a transmission electron microscope (TEM), to find that the average diameter of the Au particles was 5 nm.

The resultant multiple tunnel junction layer 6 is patterned into islands, and then conductive films (a 50 nm-thick chrome film and a 0.1 µm-thick Au film, for example) are formed by vacuum evaporation, for example, to cover the multiple tunnel junction layer 6. Then, the source electrode 2 and the drain electrode 3 are formed by normal photolithographic and etching techniques. The distance between the source electrode 2 and the drain electrode 3 is 1 µm. Thus, the single electron tunnel device as shown in FIG. 1 is obtained.

In this example, aluminum (Al) is used for the gate electrode 1, and the oxide thereof is used for the insulating film 7.

Figure 3:
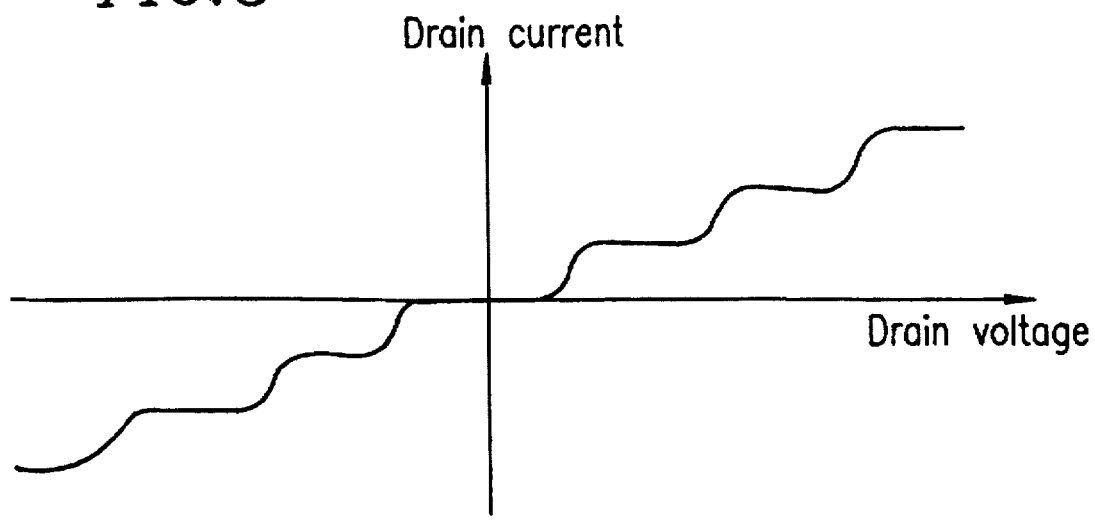
FIG. 3 is a graph showing the drain voltage-drain current characteristics of the single electron tunnel device according to the present invention.

FIG. 3 shows the voltage-current characteristics obtained when a voltage (drain voltage) is applied between the source electrode 2 and the drain electrode 3 of the single electrode tunnel device of this example. It is observed from FIG. 3 that the current (drain current) flowing between the source electrode 2 and the drain electrode 3 increases step-wise with the increase of the drain voltage (the potential at the drain electrode 3 with respect to the potential at the source electrode 2). This step-wise increase of the drain current is considered to occur as a result of the Coulomb blockade effect, i.e., the movement of individual electrons through the tunnel junctions one by one.

Figure 4:
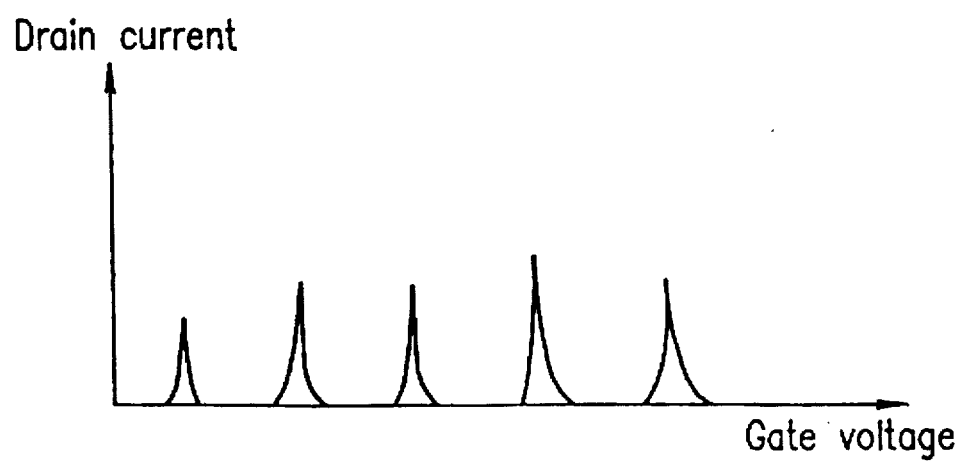
FIG. 4 is a graph showing the gate voltage-drain current characteristics of the single electron tunnel device according to the present invention.

FIG. 4 shows the change in the drain current depending on the voltage applied to the gate electrode 1. It is observed from FIG. 4 that the drain current changes periodically depending on the gate voltage. This indicates that the drain current can be controlled by use of the gate electrode.

In this example, the multiple tunnel junction layer 6 was formed by each one-time sputtering using the Au target and the insulator target. Alternatively, the substrate 10 may be placed above the Au target for five seconds and then above the insulator target for two seconds, and this operation can be repeated about 300 times. In the resultant multiple tunnel junction layer 6, the Au particles with a uniform diameter are dispersed three-dimensionally (in layers) in the electrically insulating thin film 4.

The multiple tunnel junction layer 6 with Au particles dispersed three-dimensionally in the electrically insulating thin film 4 can also be formed by placing the substrate 10 above the space between the targets 8 and 9 to allow both Au and the insulator to be deposited on the substrate 10 simultaneously by sputtering.

The multiple tunnel junction layer with metal or semiconductor particles with a diameter of 1 to 50 nm uniformly dispersed therein can also be formed by using at least one type of metal or semiconductor selected from the group consisting of aluminum (Al), silicon (Si), phosphorus (P), sulfur (S), chromium (Cr), manganese (Mn), iron (Fe), cobalt (Co), nickel (Ni), copper (Cu), zinc (Zn), gallium (Ga), germanium (Ge), arsenic (As), selenium (Se), palladium (Pd), silver (Ag), cadmium (Cd), indium (In), tin (Sn), antimony (Sb), tellurium (Te), platinum (Pt), gold (Au), and lead (Pb) as the target in place of Au.

In this example, $SiO_2$ was used as the material for the electrically insulating thin film 4. Alternatively, silicon nitride ($Si_3N_4$), aluminum oxide ($Al_2O_3$), aluminum nitride (AlN), titanium oxide ($TiO_2$), and hafnium oxide ($HfO_2$) can also be used for the electrically insulating thin film, to form a multiple tunnel junction layer with excellent corrosion resistance. Especially, aluminum oxide ($Al_2O_3$) which is solid shows stable characteristics with a smaller change with time.

The electrically insulating thin film made of the above materials can be formed by sputtering the oxide or the nitride. It can also be formed by sputtering the semiconductor material or the metal material such as silicon or aluminum in an atmosphere containing oxygen or nitrogen.

A very stable device was obtained in the combination of an oxide as the electrically insulating thin film and at least one type of metal selected from the group consisting of gold (Au), silver (Ag), copper (Cu), platinum (Pt), and palladium (Pd) as the metal particles. This is presumably because the interfaces between the oxide and these metals are well-defined and stable.

The characteristics of the device were improved by heat-treating the multiple tunnel junction layer 6 and raising the substrate temperature during the sputtering. By the heat treatment, the particles are made larger, uniform in diameter, and rounded. Rounded particles are superior to square particles in the initial characteristics, because the tunnel current tends to be influenced by the profile of the particles, and particles with smooth and stable surface allow a tunnel current to flow stably. The heat treatment also serves to eliminate distortions and defects in the particle crystals.

Figure 11:
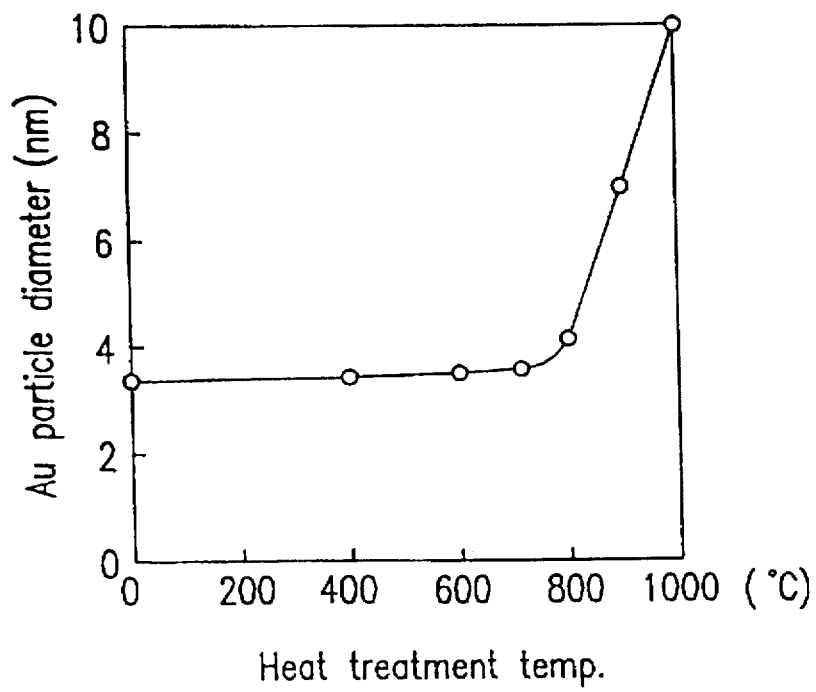
FIG. 11 is a graph showing the change in the diameter of gold particles depending on the heat treatment temperature.

If the temperature for the heat treatment is too high, the particle diameter becomes too large. FIG. 11 shows the change in the diameter of gold particles depending on the heat treatment temperature. The particle diameter sharply increases when the heat treatment temperature exceeds 700° C. Accordingly, the heat treatment temperature is preferably 700° C. or less.

When a nitride was used as the electrically insulating thin film, the increase in the particle diameter by the heat treatment was small, but the characteristics of the device were stabilized. In this case, the particle diameter was controlled by the substrate temperature during the sputtering.

The particles were rounded by raising the substrate temperature (from 200° to 400° C., for example) during the sputtering and conducting heat treatment. Rounded particles were superior in the initial characteristics to square particles. This is presumably because the tunnel current tends to be influenced by the profile of the particles and rounded particles allow the tunnel current to flow therebetween more easily and stably.

(EXAMPLE 2)

Figure 5A:
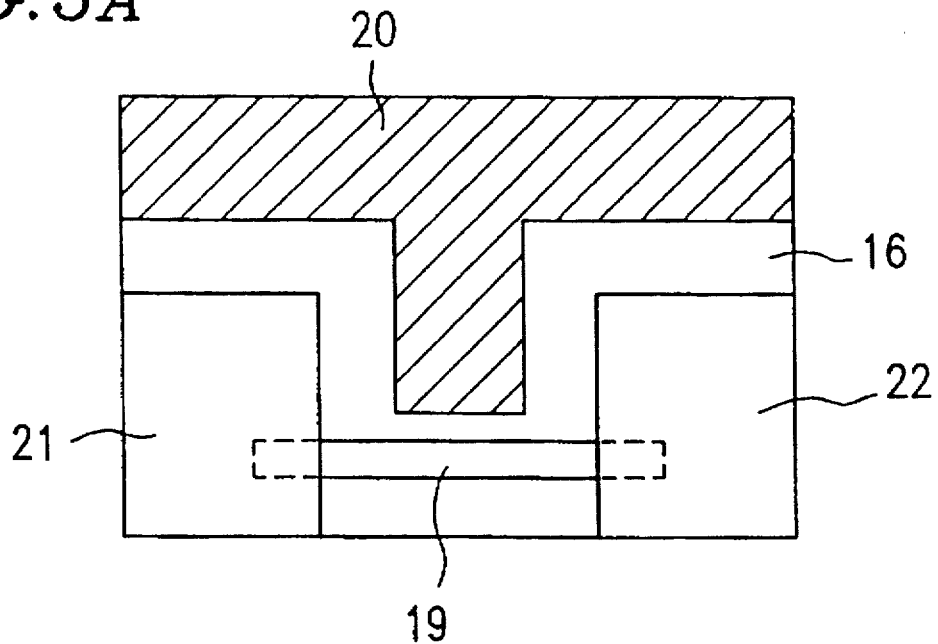
FIGS. 5A and 5B are a schematic plan view and a schematic sectional view, respectively, of another single electron tunnel device according to the present invention.
Figure 5B:
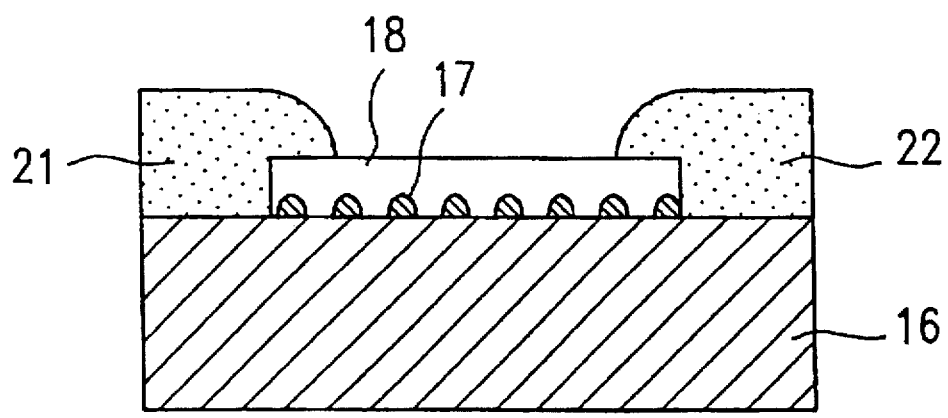

Referring to FIGS. 5A and 5B, a second example of the single electron tunnel device according to the present invention will be described.

A multiple tunnel junction layer 19 composed of an $SiO_2$ film 18 and CdSe particles 17 dispersed therein in a single layer is formed on an insulating substrate 16. The multiple tunnel junction layer 19 is then patterned by electron beam lithography and etching, to obtain strips with a width of 0.1 μm and a length of about 1.5 μm.

Thereafter, a gate electrode 20, a source electrode 21, and a drain electrode 22 are formed by a known metallization technique. The distance between the gate electrode 20 and the multiple tunnel junction layer 19 is 0.1 μm, and the distance between the source electrode 21 and the drain electrode 22 is 1 μm.

Figure 6:
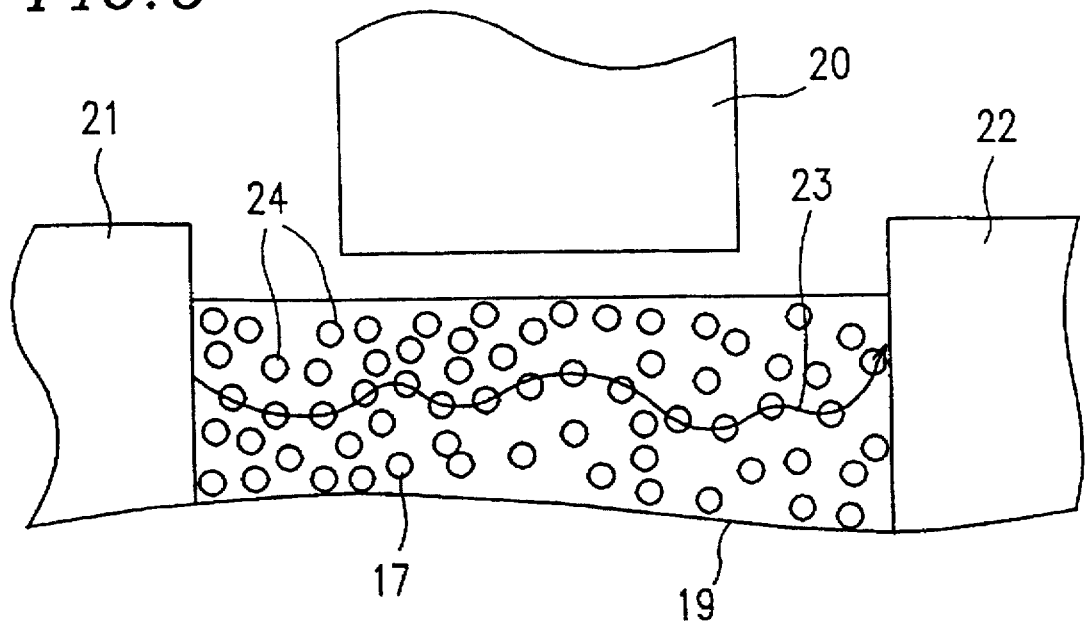
FIG. 6 is a schematic plane view showing a strip-shaped multiple tunnel junction layer of the single electron tunnel device according to the present invention.

FIG. 6 schematically shows the distribution in plane of the CdSe particles 17 dispersed in the multiple tunnel junction layer 19. There are a number of routes through which electrons can flow from the source electrode 21 to the drain electrode 22. When a voltage is applied to the gate electrode 20, multiple tunnel junctions through which electrons flow more easily are formed. When a voltage is applied between the source electrode 21 and the drain electrode 22, a channel 23 is formed in the portion of the multiple tunnel junction layer through which electrons flow most easily. Isolated particles (potential islands) 24 which do not directly contribute to the current flow are present in the vicinity of the channel 23.

In the device with the above configuration, it was observed that, when the voltage applied to the gate electrode 20 was gradually increased, electrons tunneled into the potential islands 24 isolated from the channel 23 in a manner of one electron in one potential island. This makes it possible to record information based on whether or not one electron exists in a certain potential island 24.

Figure 12:
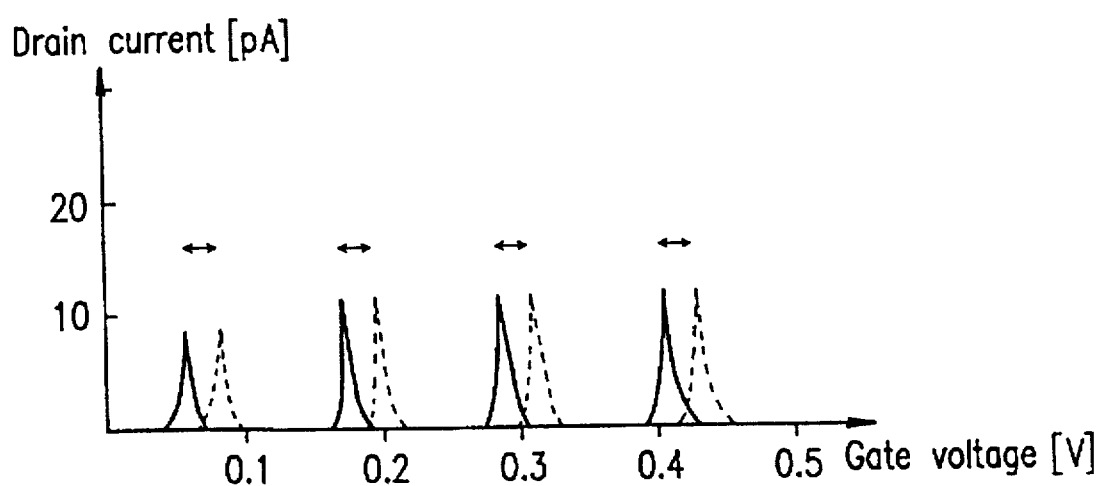
FIG. 12 is a graph showing the gate voltage-drain current characteristics obtained when an electron exists in a potential island and when it does not.

FIG. 12 shows the gate voltage-drain current characteristics obtained when an electron exists in the potential island 24 (shown by the broken line) and when no electron exists in the potential island 24 (shown by the solid line).

The change in the drain current is due to the fact that an electron flowing through the channel 23 shown in FIG. 6 is influenced by the Coulomb power of an electron existing in the island 24. The value of the gate voltage at which the drain current is the peak varies by several tens to several hundreds of millivolts depending on whether or not an electron exists in the island 24. For example, assume that the drain current is the peak when the gate voltage is 0.1 V under the condition where no electron exists in the island 24. Once an electron enters the island 24 by electron tunneling, the drain current flows little even when the gate voltage is 0.1 V. This makes it possible to detect whether or not an electron exists in the island 24 by measuring the drain current. Thus, according to the present invention, information can be stored based on a single electron.

In order to obtain a single electron tunnel device with stable characteristics, it is preferable to prevent the position of the channel 23 formed in the multiple tunnel junction layer 19 from largely varying. To achieve this, the width of the multiple tunnel junction layer 19 should be as small as about 0.1 μm. Also, the distance between the source electrode 21 and the drain electrode 22 is preferably small to reduce the resistance of the multiple tunnel junction layer 19 and thus to increase the drain current.

Figure 7:
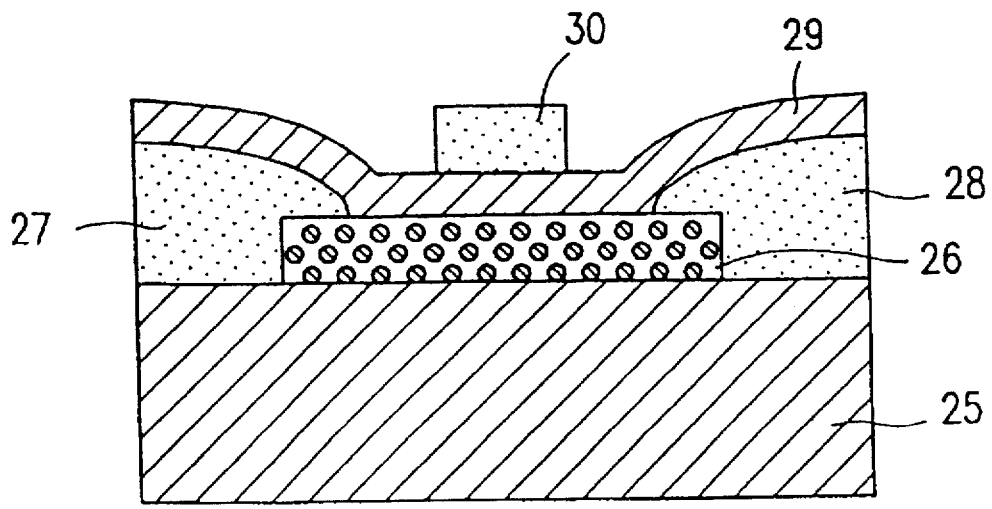
FIG. 7 is a schematic sectional view of a modified single electron tunnel device according to the present invention.

Referring to FIG. 7, an modified example of the single electron tunnel device according to the present invention will be described. In this modified example, a strip-shaped multiple tunnel junction layer 26 composed of an insulating thin film and metal or semiconductor particles dispersed therein three-dimensionally is formed on an insulating substrate 25. Thereafter, a source electrode 27 and a drain electrode 28 are formed, and then a gate electrode 30 is formed on an insulating film 29 covering the source electrode 27 and the drain electrode 28.

A channel and islands isolated from the channel are formed by applying a voltage to the gate electrode as in the above device shown in FIGS. 5A and 5B. Thus, a single electron tunnel device having a memory function is obtained.

(EXAMPLE 3)

Figure 8A:
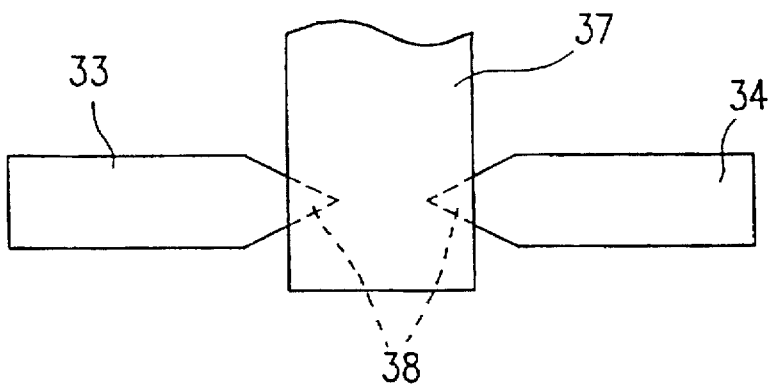
FIGS. 8A and 8B are a schematic plan view and a schematic sectional view of still another single electron tunnel device according to the present invention.
Figure 8B:
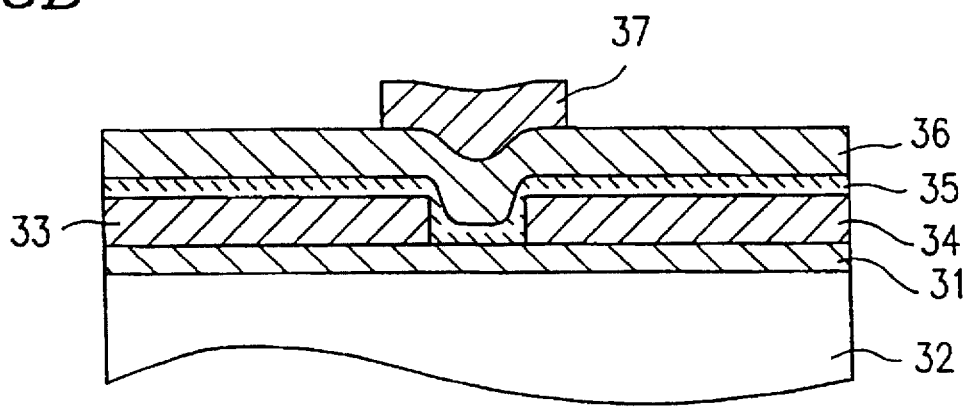

Referring to FIGS. 8A and 8B, a third example of the single electron tunnel device according to the present invention will be described. FIGS. 8A and 8B are a plan view and a sectional view, respectively, of the single electron tunnel device of this example.

As shown in FIG. 8B, the single electron tunnel device of this example is formed on an Si substrate 32 covered with a thermal oxide film 31. A source electrode 33 and a drain electrode 34 each having a tapered end as shown in FIG. 8A are formed on the thermal oxide film 31 so that the tapered ends of these electrodes 33 and 34 face each other. The distance between the tips of the tapered ends of the electrodes 33 and 34 is preferably in the range of about 100 nm to 1 μm. As the distance exceeds 1 μm, the resistance increases, preventing the tunnel current from flowing easily. The source electrode 33 and the drain electrode 34 of this example are composed of Au/Cr thin films (thickness: about 0.05 to 1 μm).

A resistance thin film layer 35 composed of an $SiO_2$ film and Au particles dispersed therein is formed to cover the electrodes 33 and 34. Unlike the device shown in FIGS. 5A and 5B, the resistance thin film layer 35 is not patterned into strips. The resistance thin film layer 35 is covered with an electrically insulating $SiO_2$ thin film 36, and a gate electrode 37 is formed on the $SiO_2$ thin film 36. The gate electrode 37 is composed of Au/Cr thin films and patterned to cover at least a portion of each of the tapered ends of the source electrode 33 and the drain electrode 34.

Thus, in this example, since the tapered ends of the electrodes 33 and 34 face each other, the electric field formed in the resistance thin film layer 35 can be locally intensified. More specifically, the strongest electric field is formed along the straight line connecting the tips of the tapered ends of the electrodes 33 and 34. This allows a channel through which a tunnel current flows to always be formed in the vicinity of the straight line connecting the tips of the tapered ends of the electrodes 33 and 34. This is the reason why the resistance thin film layer 35 is not required to be patterned into strips unlike the device shown in FIGS. 5A and 5B. This also eliminates the necessity of electron beam lithography.

The source electrode 33 and the drain electrode 34 are formed by depositing Cr to a thickness of 10 nm and then Au to a thickness of 0.1 μm on the Si thermal oxide film 31 and patterning the resultant conductive thin films by photolithography and etching.

The resistance thin film layer 35 is formed using the sputtering apparatus shown in FIG. 2 in a manner similar to that described in Example 1. The $SiO_2$ thin film 36 with a thickness of 0.1 μm is formed on the thus-formed resistance thin film layer 35. The gate electrode 37 with a thickness of 0.1 μm is then formed on the $SiO_2$ thin film 36 by the vacuum evaporation of Cr and Au and photolithography. Thus, the single electron tunnel device of this example is obtained.

It was observed that, when a voltage (drain voltage) was applied between the source electrode 33 and the drain electrode 34 of the single electron tunnel device of this example, the drain current increased step-wise with the increase of the drain voltage. This step-wise increase of the drain current is considered to occur as a result of the Coulomb blockade effect, i.e., the movement of individual electrons through the tunnel junctions one by one.

FIG. 4 shows the measurement results of the drain current obtained when a voltage is applied to the gate electrode. The drain current changes periodically depending on the gate voltage. This indicates that the drain current can be controlled by use of the gate electrode.

In the single electron tunnel device of this example, the Au particles are dispersed two-dimensionally in the resistance thin film layer. Accordingly, isolated islands are left in the vicinity of the channel through which electrons flow from the source electrode 33 to the drain electrode 34 (i.e., the isolated islands are the metal particles which do not constitute the channel but are left in the vicinity of the channel). In the device with the above configuration, it was observed that, when the gate voltage was gradually increased, electrons tunneled into the isolated islands in a manner of one electron in one isolated island. This makes it possible to record information based on whether or not one electron exists in a certain isolated island. Thus, the device can be used as a memory.

In this example, the Au/Cr thin films were used for the source electrode 33, the drain electrode 34, and the gate electrode 37. Other various conductive materials such as metal and semiconductor materials can also be used depending on the usage, though Cr is effective as it has excellent adhesion to Au. For example, the Si substrate 32 can be made of low-resistance Si and used as the gate electrode. This simplifies the device configuration, and the fabrication of such a device is easy.

When the tapered portion 38 is formed by photolithography, the Au thin film can be over-etched using an isotropic etchant such as aqua regia. With this etching, the curvature of the top portion of the Au thin film can be smaller than that of the formed resist thin film.

Figure 8C:
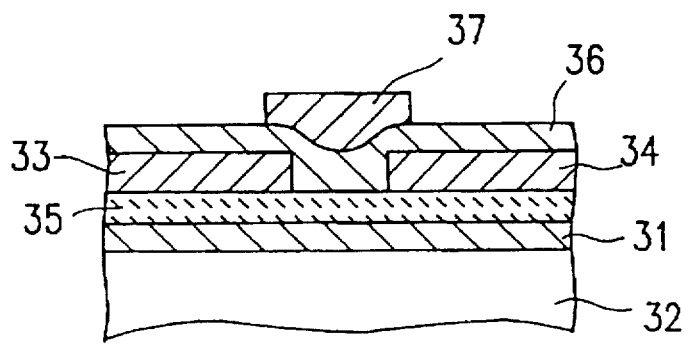
FIG. 8C is a schematic sectional view of an alternate example of the single electron tunnel device.

In this example, the resistance thin film layer 35 was formed on the source electrode 33 and the drain electrode 34. Similar effects can also be obtained by forming the resistance thin film layer 35 on the Si thermal oxide film 31 and then forming the source electrode 33 and the drain electrode 34 on the resistance thin film layer 35 as shown in FIG. 8C. However, the configuration shown in FIG. 8B is more effective since the $SiO_2$ thin film 36 can be formed immediately after the formation of the $SiO_2$ thin film with Au particles dispersed therein (the resistance thin film layer 35), allowing for continuous use of the sputtering target.

The resistance thin film layer 35 was formed by each one-time sputtering using the Au target and the insulator target. Instead, the substrate 32 can be placed above the Au target and the insulator target alternately and repeatedly, to allow Au particles with a uniform diameter to be dispersed in the electrically insulating substance. The resistance thin film layer with Au particles dispersed in the electrically insulating substance can also be formed by placing the substrate 32 above the space between the targets 8 and 9 to allow both Au and the insulator to be deposited on the substrate 32 simultaneously by sputtering.

The resistance thin film layer 35 should be composed of an electrically insulating substance with metal or semiconductor particles dispersed therein. The particles are preferably made of a precious metal or the like which is thermally and chemically stable. The degradation of the device with time can be reduced by using a thermally and chemically stable element. The size of the particles is preferably 50 nm or less in order to obtain particles dispersed comparatively uniformly with the distance therebetween of the order of nanometers. Basically important is that the gap between the particles should be large enough to allow a tunnel current to flow therethrough. A single electron tunnel device operable at a comparatively high temperature was obtained when the volume ratio of the particles to the electrically insulating substance in the portion of the resistance thin film layer 35 where the tunnel current actually flows was in the range of 5% to 70%. If the volume ratio is less than 5%, no tunnel current flows. If it exceeds 70%, adjacent metal particles attach to each other, increasing the size of the islands. Such a device can not be used as the tunnel device at room temperature. Accordingly, the distance between the metal particles is preferably 5 nm or less.

The electrically insulating substance and the electrically insulating thin film 36 can be made of a material which has a conductivity low enough to allow a change in the tunnel current to be detected, such as oxides, nitrides, and organic materials.

The resistance thin film layer with metal or semiconductor particles with a diameter of 1 to 50 nm uniformly dispersed therein can also be formed by using at leant one type of metal or semiconductor selected from the group consisting of aluminum (Al), silicon (Si), phosphorus (P), sulfur (S), chromium (Cr), manganese (Mn), iron (Fe), cobalt (Co), nickel (Ni), copper (Cu), zinc (Zn), gallium (Ga), germanium (Ge), arsenic (As), selenium (Se), palladium (Pd), silver (Ag), cadmium (Cd), indium (In), tin (Sn), antimony (Sb), tellurium (Te), platinum (Pt), gold (Au), and lead (Pb) as the target in place of Au.

In this example, $SiO_2$ was used as the material for the electrically insulating substance. Instead, silicon nitride ($Si_3N_4$), aluminum oxide ($Al_2O_3$), aluminum nitride (AlN), titanium oxide ($TiO_2$), and hafnium oxide ($HfO_2$) can also be used as the electrically insulating substance, to form the resistance thin film layer 35 with excellent corrosion resistance. The electrically insulating substance can be formed by sputtering oxide or nitride. It can also be formed by sputtering semiconductor material or metal material such as silicon and aluminum in an atmosphere containing oxygen or nitrogen.

The characteristics of the single electron tunnel device were improved by heat treatment. The temperature for the heat treatment is preferably in the range of one-fifth to three-fifths of the melting point of a metal or semiconductor material used. This improvement in the characteristics is presumably because the diameter of the particles becomes larger and uniform, and distortions and defects in the particle crystals are eliminated by the heat treatment. When a nitride material was used as the electrically insulating substance, the increase in the particle diameter by the heat treatment was small, but the characteristics of the device were stabilized. In this case, the particle diameter was controlled by the substrate temperature during the sputtering.

The particles were rounded by raising the substrate temperature during the sputtering and conducting heat treatment (before the formation of the gate electrode 37). Rounded particles were superior to square particles in the initial characteristics. This is presumably because the tunnel current tends to be influenced by the profile of the particles and rounded particles allow the tunnel current to flow therebetween more easily and stably.

(EXAMPLE 4)

Figure 9A:
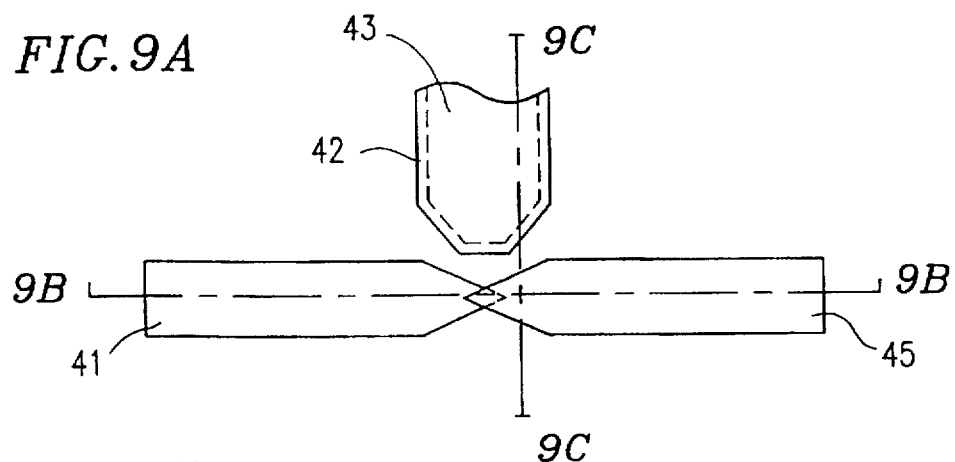
FIG. 9A is a schematic plan view.
Figure 9B:
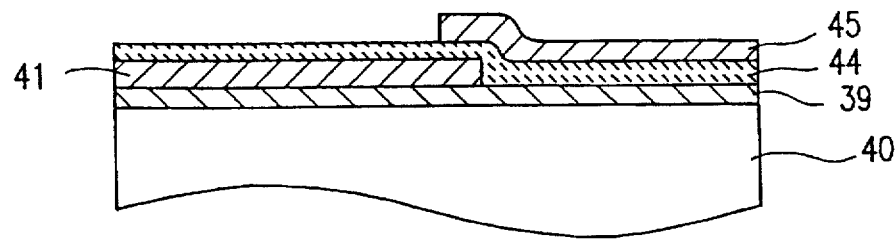
FIGS. 9B and 9C are schematic sectional views of still another single electron tunnel device according to the present invention.
Figure 9C:
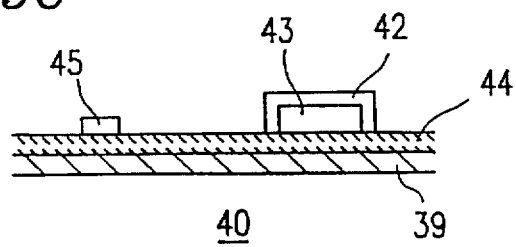
Figure 9D:
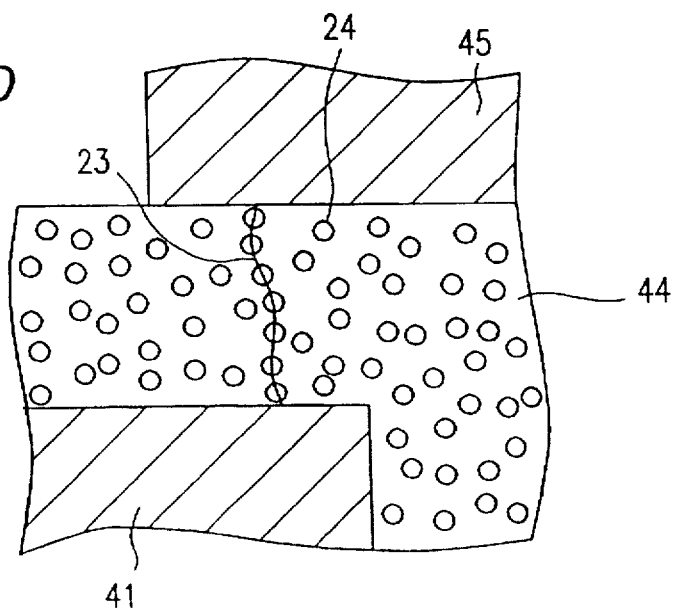
FIG. 9D is a partial enlarged sectional view of the single electron tunnel device of FIG. 9B.

Referring to FIGS. 9A to 9D, a fourth example of the single electron tunnel device according to the present invention will be described. The single electron tunnel device of this example is the same as that of Example 3 in the operation principle. FIG. 9A is a plan view of the single electron tunnel device of this example. FIGS. 9B and 9C are sectional views taken along lines A—A and B—B of FIG. 9A, respectively. FIG. 9D is a partial enlarged sectional view of the single electron tunnel device shown in FIG. 9B.

A source electrode 41 made of Au/Cr thin films having a tapered end and a gate electrode 43 made of Au/Cr thin films covered with an $SiO_2$ thin film 42 are formed on an Si substrate 40 via a thermal oxide film 39. A resistance thin film layer 44 composed of $SiO_2$ with Au particles dispersed therein is formed on the resultant structure, and then a drain electrode 45 made of Au/Cr thin films having a tapered end is formed on the resistance thin film layer 44. A portion of the resistance thin film layer 44 is interposed between the tapered ends of the source electrode 41 and the drain electrode 45.

The source electrode 41 and the gate electrode 43 are formed by depositing Cr to a thickness of 10 nm and then Au to a thickness of 0.1 μm on the Si thermal oxide film 39 by vacuum evaporation and then patterning by photolithography. The gate electrode 43 is covered with the SiO thin film 42 with a thickness of 0.1 μm.

The resistance thin film 44 is formed by repeating the alternate sputtering of Au and $SiO_2$ by about ten times using the sputtering apparatus of FIG. 2 described in Example 1. By this repeated sputtering, Au particles with a uniform diameter were dispersed in $SiO_2$ three-dimensionally. The thickness of the layer was 50 nm.

The drain electrode 45 with a thickness of 0.1 μm is then formed on the thus-formed resistance thin film layer 44 by the vacuum evaporation of Cr and Au and photolithography. Thus, the single electron tunnel device is obtained. The area of the portion of the resistance thin film layer 44 interposed between the source electrode 41 and the drain electrode 45 is about 0.01 $μm^2$. This area is preferably 1 $μm^2$ or less. When it exceeds 1 $μm^2$, the channel becomes too wide, degrading the controllability.

As shown in FIG. 9D, a channel 23 and islands 24 isolated from the channel 23 are formed by applying a voltage to the gate electrode as in the above examples. Thus, the single electron tunnel device with a memory function can be obtained. As is observed from FIG. 9D, as the resistance thin film layer 44 is thicker, the resistance increases while the drain current reduces. The thickness of the resistance thin film layer 44 is preferably in the range of about 10 nm to 1 nm.

Thus, according to the single electron tunnel device of the present invention, a multiple tunnel junction layer composed of an electrically insulating thin film and metal or semiconductor particles dispersed therein uniformly with gaps of about 1 nm is provided, and the characteristics of the device can be controlled. Since the electrically insulating thin film can be made of a material with excellent corrosion resistance, the resultant single electron tunnel device can be provided with excellent reliability and long-term stability. By changing the electrode configuration, the single electron tunnel device can serve as a transistor and a memory, or can be applied to an analog circuit or a digital circuit.

According to the method for fabricating a single electron tunnel device of the present invention, a single electron tunnel device with excellent characteristics where the type of metal or semiconductor, the size and density of particles, the distance between the particles, and the like can be easily controlled is fabricated with good reproducibility.

According to the single electron tunnel device of the present invention, a multiple tunnel junction layer composed of an electrically insulating thin film and metal or semiconductor particles dispersed therein uniformly with gaps of about 1 nm is provided without employing a special microlithographic technique, and the characteristics of the device can be controlled. Since the electrically insulating thin film can be made of a material with excellent corrosion resistance, the resultant single electron tunnel device can be provided with excellent reliability and long-term stability.

By changing the electrode configuration, the single electron tunnel device can serve as a transistor and a memory, or can be applied to an analog circuit or a digital circuit. Also, a single electron tunnel device with excellent characteristics where the type of metal or semiconductor, the size and density of particles, the distance between the particles, and the like can be easily controlled is fabricated with good reproducibility.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A single electron tunnel device comprising:
   a multiple tunnel junction layer including multiple tunnel junctions;
   first and second electrodes for applying a voltage to the multiple tunnel junction layer;
   an electrically insulating layer formed in contact with the multiple tunnel junction layer; and
   a third electrode for applying an electric field to the multiple tunnel junction layer via the electrically insulating layer,
   wherein the multiple tunnel junction layer includes an electrically insulating thin film and at least one of metal particles and semiconductor particles dispersed in the electrically insulating thin film.

2. A single electron tunnel device according to claim 1, wherein the diameter of the particles is 50 nm or less.

3. A single electron tunnel device according to claim 1, wherein the average distance between the particles is 5 nm or less.

4. A single electron tunnel device according to claim 1, wherein the particles are dispersed in layers in the multiple tunnel junction layer.

5. A single electron tunnel device according to claim 1, wherein the electrically insulating thin film is made of an oxide, and the particles are made of at least one type of metal selected from the group consisting of gold (Au), silver (Ag), copper (Cu), platinum (Pt), and palladium (Pd).

6. A single electron tunnel device according to claim 1, wherein the electrically insulating thin film includes as a major component at least one type of material selected from the group consisting of oxides of silicon (Si), aluminum (Al), titanium (Ti), and hafnium (Hf), and nitrides of silicon (Si) and aluminum (Al).

7. A single electron tunnel device comprising:
   a resistance layer;
   first and second electrodes for applying a voltage to the resistance layer; and
   a third electrode for adjusting an electric field formed by the first and second electrodes,
   wherein the resistance layer includes an electrically insulating substance with at least one additive forming low-potential islands therein.

8. A single electron tunnel device according to claim 7, wherein the first electrode is formed on a first major plane of the resistance layer, and the second electrode is formed on a second major plane of the resistance layer which is different from the first major plane.

9. A single electron tunnel device according to claim 7, wherein the first and second electrodes are formed on a same plane of the resistance layer.

10. A single electron tunnel device according to claim 7, wherein the distance between portions of the first and second electrodes which are closest to each other is 1 μm or less, and the width of at least one of the first and second electrodes is 100 nm or less.

11. A single electron tunnel device according to claim 7, wherein at least one of the first and second electrodes has a tapered end, and the tapered end faces the other electrode.

12. A single electron tunnel device according to claim 8, wherein a tip portion of the first electrode overlaps a tip portion of the second electrode, and the area of the overlapping portion is 1 μm$^2$ or less.

13. A single electron tunnel device according to claim 7, wherein the resistance layer includes an electrically insulating thin film and at least one of metal particles and semiconductor particles dispersed in the electrically insulating thin film.

14. A single electron tunnel device according to claim 7, wherein at least one of metal particles and semiconductor particles are dispersed three-dimensionally in the resistance layer.

15. A single electron tunnel device according to claim 13, wherein the diameter of the particles is 50 nm or less.

16. A single electron tunnel device according to claim 13, wherein the average distance between the particles is 5 nm or less.

17. A single electron tunnel device according to claim 13, wherein the particles are dispersed in layers in the electrically insulating substance.

18. A single electron tunnel device according to claim 13, wherein the electrically insulating substance is made of an oxide or a nitride.

19. A single electron tunnel device according to claim 13, wherein the electrically insulating thin film is made of an oxide, and the particles are made of at least one type of metal selected from the group consisting of gold (Au), silver (Ag), copper (Cu), platinum (Pt), and palladium (Pd).

20. A single electron tunnel device according to claim 13, wherein the electrically insulating thin film includes as a major component at least one type of material selected from the group consisting of oxides of silicon (Si), aluminum (Al), titanium (Ti), and hafnium (Hf), and nitrides of silicon (Si) and aluminum (Al).

* * * * *